US010817256B2

United States Patent
Rossbacher

(10) Patent No.: US 10,817,256 B2
(45) Date of Patent: *Oct. 27, 2020

(54) VOLUME CONTROL

(71) Applicant: Oath Inc., New York, NY (US)

(72) Inventor: Andreas Rossbacher, San Francisco, CA (US)

(73) Assignee: Oath Inc., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/558,194

(22) Filed: Sep. 2, 2019

(65) Prior Publication Data

US 2019/0384567 A1  Dec. 19, 2019

Related U.S. Application Data

(63) Continuation of application No. 15/978,580, filed on May 14, 2018, now Pat. No. 10,402,155, which is a continuation of application No. 15/351,627, filed on Nov. 15, 2016, now Pat. No. 9,971,561.

(51) Int. Cl.
| | | |
|---|---|---|
| *G06F 3/16* | (2006.01) | |
| *H03G 3/00* | (2006.01) | |
| *H03G 3/02* | (2006.01) | |
| *H03G 3/20* | (2006.01) | |

(52) U.S. Cl.
CPC ............... *G06F 3/165* (2013.01); *H03G 3/00* (2013.01); *H03G 3/02* (2013.01); *H03G 3/20* (2013.01)

(58) Field of Classification Search
CPC . G06F 3/185; G03G 3/00; G03G 3/02; G03G 3/20
See application file for complete search history.

(56) References Cited

U.S. PATENT DOCUMENTS

| 5,303,371 A * | 4/1994 | Nakajima | H03G 3/001 381/109 |
|---|---|---|---|
| 9,971,561 B1 * | 5/2018 | Rossbacher | H03G 3/00 |
| 10,402,155 B2 * | 9/2019 | Rossbacher | H03G 3/02 |
| 2018/0307271 A1 * | 10/2018 | Behar | G06F 1/162 |

* cited by examiner

*Primary Examiner* — Andrew L Sniezek

(74) *Attorney, Agent, or Firm* — Cooper Legal Group, LLC

(57) ABSTRACT

One or more computing devices, systems, and/or methods for controlling a volume level of a device are provided. For example, a first button corresponding to increasing a volume level of a device may be selected, and the volume level may be increased by a first amount (e.g., 10%). A second button corresponding to decreasing the volume level of the device may be selected. If the second button is determined to have been selected within a threshold period of time after the selection of the first button, the volume level may be decreased by a second amount (e.g., 5%). If the second button is determined to have not been selected within the threshold period of time after the selection of the first button, the volume level may be decreased by the first amount (e.g., 10%).

20 Claims, 10 Drawing Sheets

VOLUME CONTROL

RELATED APPLICATIONS

This application claims priority to and is a continuation of U.S. application Ser. No. 15/978,580, filed on May 14, 2018, entitled "VOLUME CONTROL", which claims priority to and is a continuation of U.S. application Ser. No. 15/351,627, filed on Nov. 15, 2016, entitled "VOLUME CONTROL". U.S. application Ser. No. 15/978,580 and U.S. application Ser. No. 15/351,627 are incorporated herein.

BACKGROUND

Many devices, such as mobile phones, tablets, laptops, mp3 players and/or desktop computers, provide audio output. The audio output may be converted to sound and transmitted via speakers or headphones that are physically connected to the device or wirelessly connected to the device. The speakers or headphones may transmit the sound at a volume level. Sometimes, a user of the device may want to increase the volume level or decrease the volume level.

SUMMARY

If the volume level is too low for the preferences of the user, the user may increase the volume level. After increasing the volume level, the user may determine that the volume level is too high for the preferences of the user, and may thus decrease the volume level. Thus, the volume level may fluctuate from being too low to being too high.

Alternatively, if the volume level is too high for the preferences of the user, the user may decrease the volume level. After decreasing the volume level, the user may determine that the volume level is too low for the preferences of the user, and may thus increase the volume level. Thus, the volume level may fluctuate from being too high to being too low.

In accordance with the present disclosure, one or more computing devices and/or methods for controlling a volume level of a device (e.g., a mobile device) are provided. In an example, a selection (e.g., press, tap, etc.) of a first button (e.g., an increase volume button) of the device corresponding to modifying (e.g., increasing) a volume level of the device in a first direction (e.g., up) may be received. In response to receiving the selection of the first button, the volume level of the device may be modified by a first amount (e.g., 10%) in the first direction (e.g., up). A selection of a second button (e.g., a decrease volume button) of the device corresponding to modifying (e.g., decreasing) the volume level of the mobile device in a second direction (e.g., down) may be received. In response to receiving the selection of the second button, a determination may be made as to whether the selection of the second button (e.g., the decrease volume button) was received within a threshold period of time (e.g., 4 seconds) after the selection of the first button (e.g., the increase volume button). In response to determining that the selection of the second button (e.g., the decrease volume button) was received within the threshold period of time (e.g., 4 seconds) after the selection of the first button (e.g., the increase volume button), the volume level of the device may be modified (e.g., decreased) by a second amount (e.g., 5%) in the second direction (e.g., down). Alternatively, in response to determining that the selection of the second button (e.g., the decrease volume button) was not received within the threshold period of time (e.g., 4 seconds) after the selection of the first button (e.g., the increase volume button), the volume level of the device may be modified (e.g., decreased) by the first amount (e.g., 10%) in the second direction (e.g., down).

DESCRIPTION OF THE DRAWINGS

While the techniques presented herein may be embodied in alternative forms, the particular embodiments illustrated in the drawings are only a few examples that are supplemental of the description provided herein. These embodiments are not to be interpreted in a limiting manner, such as limiting the claims appended hereto.

DETAILED DESCRIPTION

Subject matter will now be described more fully hereinafter with reference to the accompanying drawings, which form a part hereof, and which show, by way of illustration, specific example embodiments. This description is not intended as an extensive or detailed discussion of known concepts. Details that are known generally to those of ordinary skill in the relevant art may have been omitted, or may be handled in summary fashion.

The following subject matter may be embodied in a variety of different forms, such as methods, devices, components, and/or systems. Accordingly, this subject matter is not intended to be construed as limited to any example embodiments set forth herein. Rather, example embodiments are provided merely to be illustrative. Such embodiments may, for example, take the form of hardware, software, firmware or any combination thereof.

1. Computing Scenario

The following provides a discussion of some types of computing scenarios in which the disclosed subject matter may be utilized and/or implemented.

1.1. Networking

Figure 1:
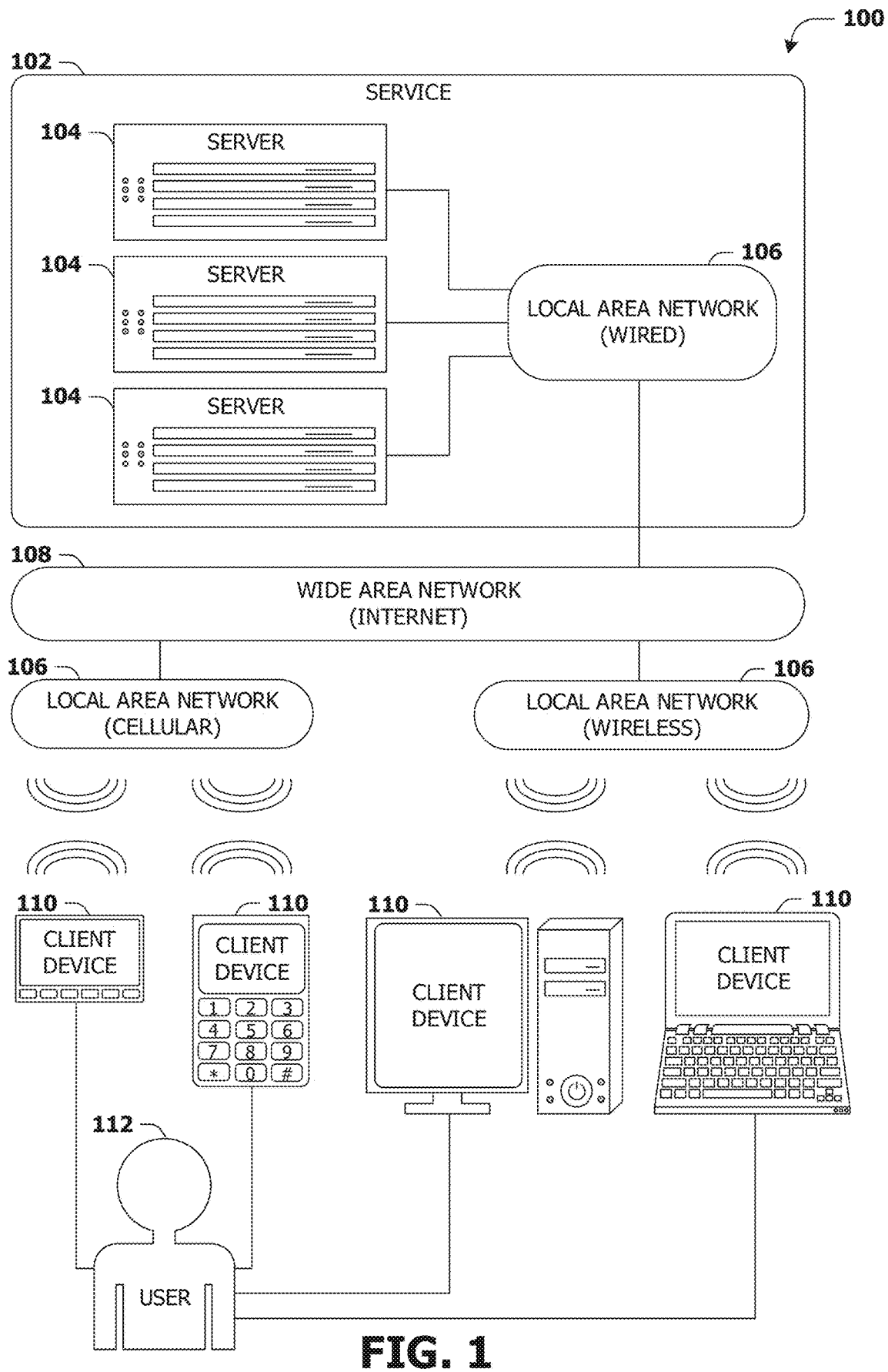
FIG. 1 is an illustration of a scenario involving various examples of networks that may connect servers and clients.

FIG. 1 is an interaction diagram of a scenario 100 illustrating a service 102 provided by a set of servers 104 to a set of client devices 110 via various types of networks. The servers 104 and/or client devices 110 may be capable of transmitting, receiving, processing, and/or storing many types of signals, such as in memory as physical memory states.

The servers 104 of the service 102 may be internally connected via a local area network 106 (LAN), such as a wired network where network adapters on the respective servers 104 are interconnected via cables (e.g., coaxial and/or fiber optic cabling), and may be connected in various topologies (e.g., buses, token rings, meshes, and/or trees). The servers 104 may be interconnected directly, or through one or more other networking devices, such as routers, switches, and/or repeaters. The servers 104 may utilize a variety of physical networking protocols (e.g., Ethernet and/or Fiber Channel) and/or logical networking protocols (e.g., variants of an Internet Protocol (IP), a Transmission Control Protocol (TCP), and/or a User Datagram Protocol (UDP). The local area network 106 may include, e.g., analog telephone lines, such as a twisted wire pair, a coaxial cable, full or fractional digital lines including T1, T2, T3, or T4 type lines, Integrated Services Digital Networks (ISDNs), Digital Subscriber Lines (DSLs), wireless links including satellite links, or other communication links or channels, such as may be known to those skilled in the art. The local area network 106 may be organized according to one or more network architectures, such as server/client, peer-to-peer, and/or mesh architectures, and/or a variety of roles, such as administrative servers, authentication servers, security monitor servers, data stores for objects such as files and databases, business logic servers, time synchronization servers, and/or front-end servers providing a user-facing interface for the service 102.

Likewise, the local area network 106 may comprise one or more sub-networks, such as may employ differing architectures, may be compliant or compatible with differing protocols and/or may interoperate within the local area network 106. Additionally, a variety of local area networks 106 may be interconnected; e.g., a router may provide a link between otherwise separate and independent local area networks 106.

In the scenario 100 of FIG. 1, the local area network 106 of the service 102 is connected to a wide area network 108 (WAN) that allows the service 102 to exchange data with other services 102 and/or client devices 110. The wide area network 108 may encompass various combinations of devices with varying levels of distribution and exposure, such as a public wide-area network (e.g., the Internet) and/or a private network (e.g., a virtual private network (VPN) of a distributed enterprise).

In the scenario 100 of FIG. 1, the service 102 may be accessed via the wide area network 108 by a user 112 of one or more client devices 110, such as a portable media player (e.g., an electronic text reader, an audio device, or a portable gaming, exercise, or navigation device); a portable communication device (e.g., a camera, a phone, a wearable or a text chatting device); a workstation; and/or a laptop form factor computer. The respective client devices 110 may communicate with the service 102 via various connections to the wide area network 108. As a first such example, one or more client devices 110 may comprise a cellular communicator and may communicate with the service 102 by connecting to the wide area network 108 via a wireless local area network 106 provided by a cellular provider. As a second such example, one or more client devices 110 may communicate with the service 102 by connecting to the wide area network 108 via a wireless local area network 106 provided by a location such as the user's home or workplace (e.g., a WiFi (Institute of Electrical and Electronics Engineers (IEEE) Standard 802.11) network or a Bluetooth (IEEE Standard 802.15.1) personal area network). In this manner, the servers 104 and the client devices 110 may communicate over various types of networks. Other types of networks that may be accessed by the servers 104 and/or client devices 110 include mass storage, such as network attached storage (NAS), a storage area network (SAN), or other forms of computer or machine readable media.

1.2. Server Configuration

Figure 2:
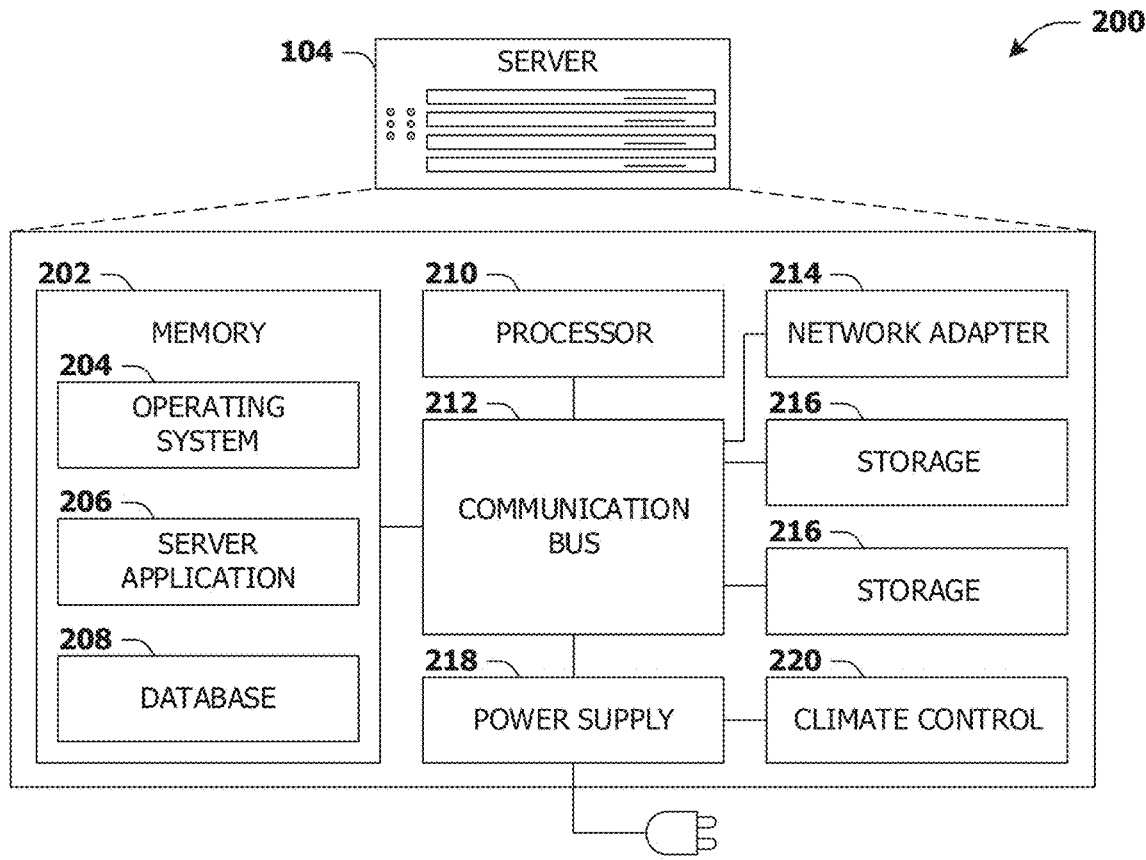
FIG. 2 is an illustration of a scenario involving an example configuration of a server that may utilize and/or implement at least a portion of the techniques presented herein.

FIG. 2 presents a schematic architecture diagram 200 of a server 104 that may utilize at least a portion of the techniques provided herein. Such a server 104 may vary widely in configuration or capabilities, alone or in conjunction with other servers, in order to provide a service such as the service 102.

The server 104 may comprise one or more processors 210 that process instructions. The one or more processors 210 may optionally include a plurality of cores; one or more coprocessors, such as a mathematics coprocessor or an integrated graphical processing unit (GPU); and/or one or more layers of local cache memory. The server 104 may comprise memory 202 storing various forms of applications, such as an operating system 204; one or more server applications 206, such as a hypertext transport protocol (HTTP) server, a file transfer protocol (FTP) server, or a simple mail transport protocol (SMTP) server; and/or various forms of data, such as a database 208 or a file system. The server 104 may comprise a variety of peripheral components, such as a wired and/or wireless network adapter 214 connectable to a local area network and/or wide area network; one or more storage components 216, such as a hard disk drive, a solid-state storage device (SSD), a flash memory device, and/or a magnetic and/or optical disk reader.

The server 104 may comprise a mainboard featuring one or more communication buses 212 that interconnect the processor 210, the memory 202, and various peripherals, using a variety of bus technologies, such as a variant of a serial or parallel AT Attachment (ATA) bus protocol; a Uniform Serial Bus (USB) protocol; and/or Small Computer System Interface (SCI) bus protocol. In a multibus scenario, a communication bus 212 may interconnect the server 104 with at least one other server. Other components that may optionally be included with the server 104 (though not shown in the schematic diagram 200 of FIG. 2) include a display; a display adapter, such as a graphical processing unit (GPU); input peripherals, such as a keyboard and/or mouse; and a flash memory device that may store a basic input/output system (BIOS) routine that facilitates booting the server 104 to a state of readiness.

The server 104 may operate in various physical enclosures, such as a desktop or tower, and/or may be integrated with a display as an "all-in-one" device. The server 104 may be mounted horizontally and/or in a cabinet or rack, and/or may simply comprise an interconnected set of components. The server 104 may comprise a dedicated and/or shared power supply 218 that supplies and/or regulates power for the other components. The server 104 may provide power to and/or receive power from another server and/or other devices. The server 104 may comprise a shared and/or dedicated climate control unit 220 that regulates climate properties, such as temperature, humidity, and/or airflow. Many such servers 104 may be configured and/or adapted to utilize at least a portion of the techniques presented herein.

1.3. Client Device Configuration

Figure 3:
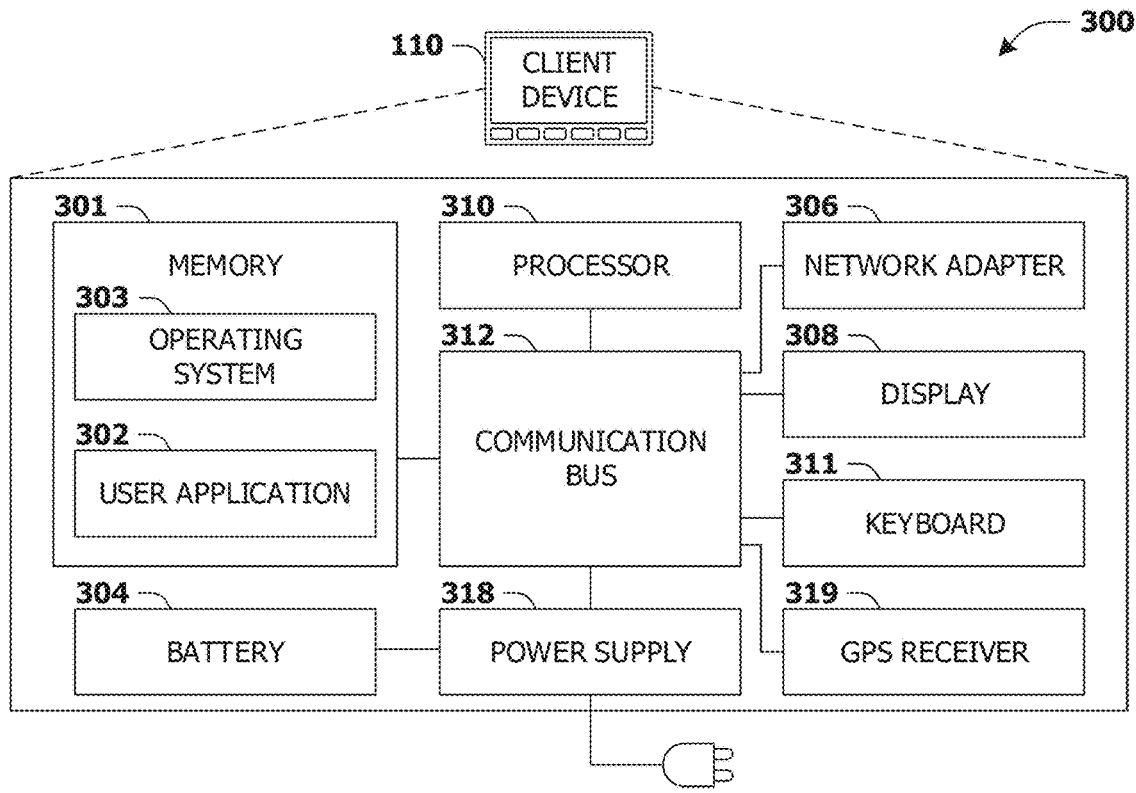
FIG. 3 is an illustration of a scenario involving an example configuration of a client that may utilize and/or implement at least a portion of the techniques presented herein.

FIG. 3 presents a schematic architecture diagram 300 of a client device 110 whereupon at least a portion of the techniques presented herein may be implemented. Such a client device 110 may vary widely in configuration or capabilities, in order to provide a variety of functionality to a user such as the user 112. The client device 110 may be provided in a variety of form factors, such as a desktop or tower workstation; an "all-in-one" device integrated with a display 308; a laptop, tablet, convertible tablet, or palmtop device; a wearable device mountable in a headset, eyeglass, earpiece, and/or wristwatch, and/or integrated with an article of clothing; and/or a component of a piece of furniture, such as a tabletop, and/or of another device, such as a vehicle or residence. The client device 110 may serve the user in a variety of roles, such as a workstation, kiosk, media player, gaming device, and/or appliance.

The client device 110 may comprise one or more processors 310 that process instructions. The one or more processors 310 may optionally include a plurality of cores; one or more coprocessors, such as a mathematics coprocessor or an integrated graphical processing unit (GPU); and/or one or more layers of local cache memory. The client device 110 may comprise memory 301 storing various forms of applications, such as an operating system 303; one or more user applications 302, such as document applications, media applications, file and/or data access applications, communication applications such as web browsers and/or email clients, utilities, and/or games; and/or drivers for various peripherals. The client device 110 may comprise a variety of peripheral components, such as a wired and/or wireless network adapter 306 connectable to a local area network and/or wide area network; one or more output components, such as a display 308 coupled with a display adapter (optionally including a graphical processing unit (GPU)), a sound adapter coupled with a speaker, and/or a printer; input devices for receiving input from the user, such as a keyboard 311, a mouse, a microphone, a camera, and/or a touch-sensitive component of the display 308; and/or environmental sensors, such as a global positioning system (GPS) receiver 319 that detects the location, velocity, and/or acceleration of the client device 110, a compass, accelerometer, and/or gyroscope that detects a physical orientation of the client device 110. Other components that may optionally be included with the client device 110 (though not shown in the schematic architecture diagram 300 of FIG. 3) include one or more storage components, such as a hard disk drive, a solid-state storage device (SSD), a flash memory device, and/or a magnetic and/or optical disk reader; and/or a flash memory device that may store a basic input/output system (BIOS) routine that facilitates booting the client device 110 to a state of readiness; and a climate control unit that regulates climate properties, such as temperature, humidity, and airflow.

The client device 110 may comprise a mainboard featuring one or more communication buses 312 that interconnect the processor 310, the memory 301, and various peripherals, using a variety of bus technologies, such as a variant of a serial or parallel AT Attachment (ATA) bus protocol; the Uniform Serial Bus (USB) protocol; and/or the Small Computer System Interface (SCI) bus protocol. The client device 110 may comprise a dedicated and/or shared power supply 318 that supplies and/or regulates power for other components, and/or a battery 304 that stores power for use while the client device 110 is not connected to a power source via the power supply 318. The client device 110 may provide power to and/or receive power from other client devices.

In some scenarios, as a user 112 interacts with a software application on a client device 110 (e.g., an instant messenger and/or electronic mail application), descriptive content in the form of signals or stored physical states within memory (e.g., an email address, instant messenger identifier, phone number, postal address, message content, date, and/or time) may be identified. Descriptive content may be stored, typically along with contextual content. For example, the source of a phone number (e.g., a communication received from another user via an instant messenger application) may be stored as contextual content associated with the phone number. Contextual content, therefore, may identify circumstances surrounding receipt of a phone number (e.g., the date or time that the phone number was received), and may be associated with descriptive content. Contextual content, may, for example, be used to subsequently search for associated descriptive content. For example, a search for phone numbers received from specific individuals, received via an instant messenger application or at a given date or time, may be initiated. The client device 110 may include one or more servers that may locally serve the client device 110 and/or other client devices of the user 112 and/or other individuals. For example, a locally installed webserver may provide web content in response to locally submitted web requests. Many such client devices 110 may be configured and/or adapted to utilize at least a portion of the techniques presented herein.

2. Presented Techniques

One or more computing devices and/or techniques for controlling a volume level of a device are provided. For example, a user of the device may want to adjust the volume level of the device, by increasing the volume level, decreasing the volume level, etc., to conform to preferences of the user. Adjusting the volume level often makes use of two opposite controls, and thus may involve (e.g., repeatedly) alternating between increasing and/or decreasing the volume level in an attempt to identify a target volume level (e.g., that is "just right") desired by the user. Controlling the volume level may thus consume a significant amount of time and/or resources of the user (e.g., to raise the volume level three times, listen to determine whether the volume level is "just right," determine that the volume level is too high, lower the volume level twice, listen again to determine whether the volume level is "just right," determine that the volume level is too low, raise the volume level, etc.). Available methods, which often involve each adjustment of the volume level corresponding to an equal amount (e.g., a first selection to increase the volume level increases the volume level by 10%, while a second selection to decrease the volume level decreases the volume level by 10%, etc.) may also leave the user with having to choose between a first volume level that is lower than the target volume level desired by the user, and a second volume level that is higher than the target volume level desired by the user (e.g., if the target volume level is 5% greater than the first volume level and 5% less than the second volume level). Thus, in accordance with one or more of the techniques presented herein, volume level may be controlled in a manner that is efficient, convenient, precise and/or timely.

Figure 4:
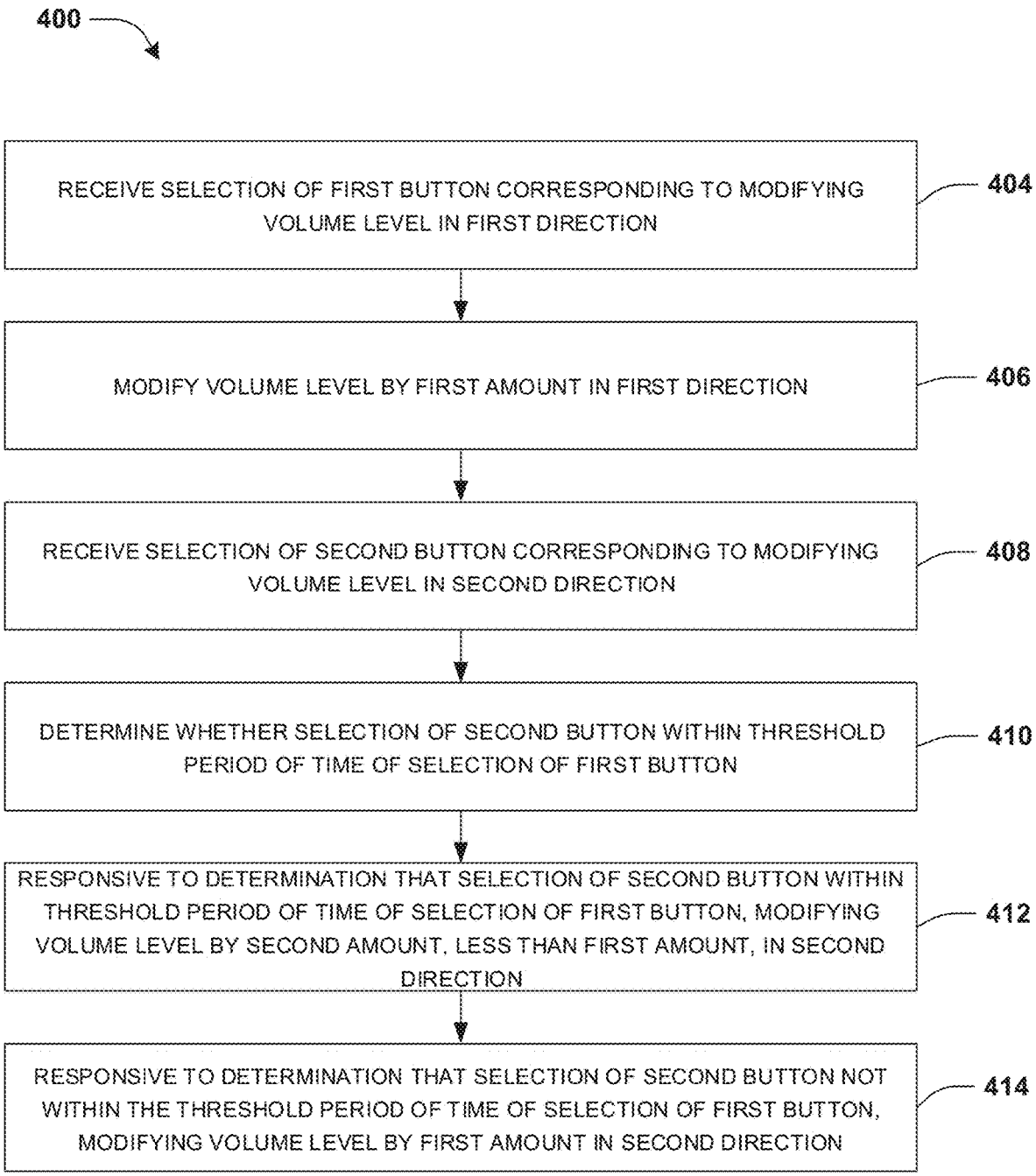
FIG. 4 is a flow chart illustrating an example method for controlling a volume level of a device.

An embodiment of controlling a volume level of a device is illustrated by an example method 400 of FIG. 4. A user, such as user Jill, (e.g., and/or a device associated with the user) may access and/or interact with an application that provides audio output that may be converted to sound. The application may provide the audio output by playing one or more songs (e.g., as part of a playlist), playing a video (e.g., stored on the device or accessed via the Internet) and/or as sound effects that arise during the use of one or more features (e.g., a game) of the application. Accordingly, at 404, a selection of a first button of the device may be received. The first button may correspond to modifying a volume level of the mobile device in a first direction (e.g., along a (e.g., 1 dimensional) spectrum). For example, the first button may be configured to, upon selection, increase the volume level.

At 406, in response to receiving the selection of the first button, the volume level of the device may be modified by a first amount in the first direction. The first amount may be a portion (e.g., 10%) of a total range (e.g., 0%-100%) in which the volume level can be adjusted. In some examples where the volume level is represented by individual (e.g., stacked) bars that together form a total number of bars (e.g., 16 bars), each individual bar may represent a change in the volume level by the first amount (e.g., ¹/₁₆, or 6.25%).

At 408, a selection of a second button of the device may be received. The second button may correspond to modifying the volume level of the mobile device in a second direction (e.g., along the (e.g., 1 dimensional) spectrum), where the second direction may be different than (e.g., opposite) the first direction. For example, the second button may be configured to, upon selection, decrease the volume level.

In an example, the first direction may correspond to an increase in the volume level, while the second direction may correspond to a decrease in the volume level. Alternatively, the first direction may correspond to a decrease in the volume level, while the second direction may correspond to an increase in the volume level.

In an example, the first button may comprise a first mechanical button (e.g., built into the device) and/or the second button may comprise a second mechanical button (e.g., built into the device). In another example, the first button may comprise a first capacitive button (e.g., built into a touchscreen) and/or the second button may comprise a second capacitive button (e.g., built into the touchscreen). In another example, the first button may comprise a first virtual button (e.g., displayed on a touchscreen) and/or the second button may comprise a second virtual button (e.g., displayed on the touchscreen).

In an example, where the device comprises a mobile phone or a tablet, the first button may comprise a first volume button of the mobile phone or the tablet and/or the second button may comprise a second volume button of the mobile phone or the tablet. In another example, the first button may comprise a first volume button of headphones or speakers (e.g., coupled to the device) and/or the second button may comprise a second volume button of the headphones or the speakers.

At 410, in response to receiving the selection of the second button, a determination may be made as to whether the selection of the second button was received within a threshold period of time after the selection of the first button. For example, the threshold period of time, based upon user input, default settings, etc., may be 3 seconds. In this example, if the selection of the second button was received 2 seconds after the selection of the first button, the selection may be determined to have been received within the threshold period of time, but if the selection of the second button was received 5 seconds after the selection of the first button, the selection may be determined to not have been received within the threshold period of time.

At 412, in response to determining that the selection of the second button was received within the threshold period of time after the selection of the first button, the volume level of the device may be modified by a second amount in the second direction. The second amount may be different than (e.g., less than) the first amount. The second amount may be a portion (e.g., 5%) of the total range (e.g., 0%-100%) in which the volume level can be adjusted. For example, if the selection of the first button caused the volume level to increase by 10%, the selection of the second button may cause the volume level to decrease by 5%.

In an example, after the volume level is modified by the second amount in the second direction, a second selection of the first button may be received. In response to receiving the second selection of the first button, a determination may be made as to whether the second selection of the first button was received within a second threshold period of time after the selection of the second button. In response to determining that the second selection of the first button was received within the second threshold period of time after the selection of the second button, the volume level of the device may be modified by a third amount in the first direction. The third amount may be equal to or different than (e.g., less than) the first amount and/or the second amount. For example, the second amount may be about half of the first amount and/or the third amount may be about half of the second amount. The third amount may be a portion (e.g., 2.5%) of the total range (e.g., 0%-100%) in which the volume level can be adjusted. For example, if the selection of the first button caused the volume level to increase by 10%, and the selection of the second button caused the volume level to decrease by 5%, the second selection of the first button may cause the volume level to increase by 2.5%. It may be appreciated that the first threshold period of time may be equal to or different than (e.g., greater than, less than, etc.) the second threshold period of time. It may be appreciated that this pattern of modifying the volume level by a decreasing (e.g., asymmetric) amount may be continued for any number of times, and that for each iteration, the decreasing amount may decrease by a constant proportion (e.g., half, a third, etc.).

At 414, in response to determining that the selection of the second button was not received within the threshold period of time after the selection of the first button, the volume level of the device may be modified by the first amount in the second direction. For example, if the selection of the second button caused the volume level to increase by 10%, the selection of the second button may cause the volume level to decrease by 10%.

It may be appreciated that in some examples, instead of determining whether the selection of the second button was received within the threshold period of time after the selection of the first button, and acting in accordance with this determination, an alternative determination may be made as to whether the selection of the first button, the selection of the second button, and/or one or more other aspects of the device meet one or more defined conditions, and the volume level may be modified based upon the alternative determination.

It may be appreciated the volume level is an example of a setting level, and that at least some of the disclosed techniques may be implemented in the context of a setting level other than the volume level. For example, the setting level may comprise a contrast level, the first button may correspond to modifying the contrast level in a first direction and/or the second button may correspond to modifying the contrast level in a second direction. In another example, the setting level may comprise a brightness level, the first button may correspond to modifying the brightness level in a first direction and/or the second button may correspond to modifying the brightness level in a second direction. In another example, the setting level may comprise a saturation level, the first button may correspond to modifying the saturation level in a first direction and/or the second button may correspond to modifying the saturation level in a second direction. In another example, the setting level may comprise a sharpness level, the first button may correspond to modifying the sharpness level in a first direction and/or the second button may correspond to modifying the sharpness level in a second direction. In another example, the setting level may comprise a fast forwarding level, the first button may correspond to modifying the fast forwarding level in a first direction and/or the second button may correspond to modifying the fast forwarding level in a second direction. In another example, the setting level may comprise a rewinding level, the first button may correspond to modifying the rewinding level in a first direction and/or the second button may correspond to modifying the rewinding level in a second direction. In another example, the setting level may comprise a website browsing level, the first button may correspond to modifying the website browsing level in a first direction and/or the second button may correspond to modifying the website browsing level in a second direction (e.g., such that the first button causes the user to flip 4 websites backwards through a history, and the second button causes the user to flip 2 websites forward through the history).

Figure 5A:
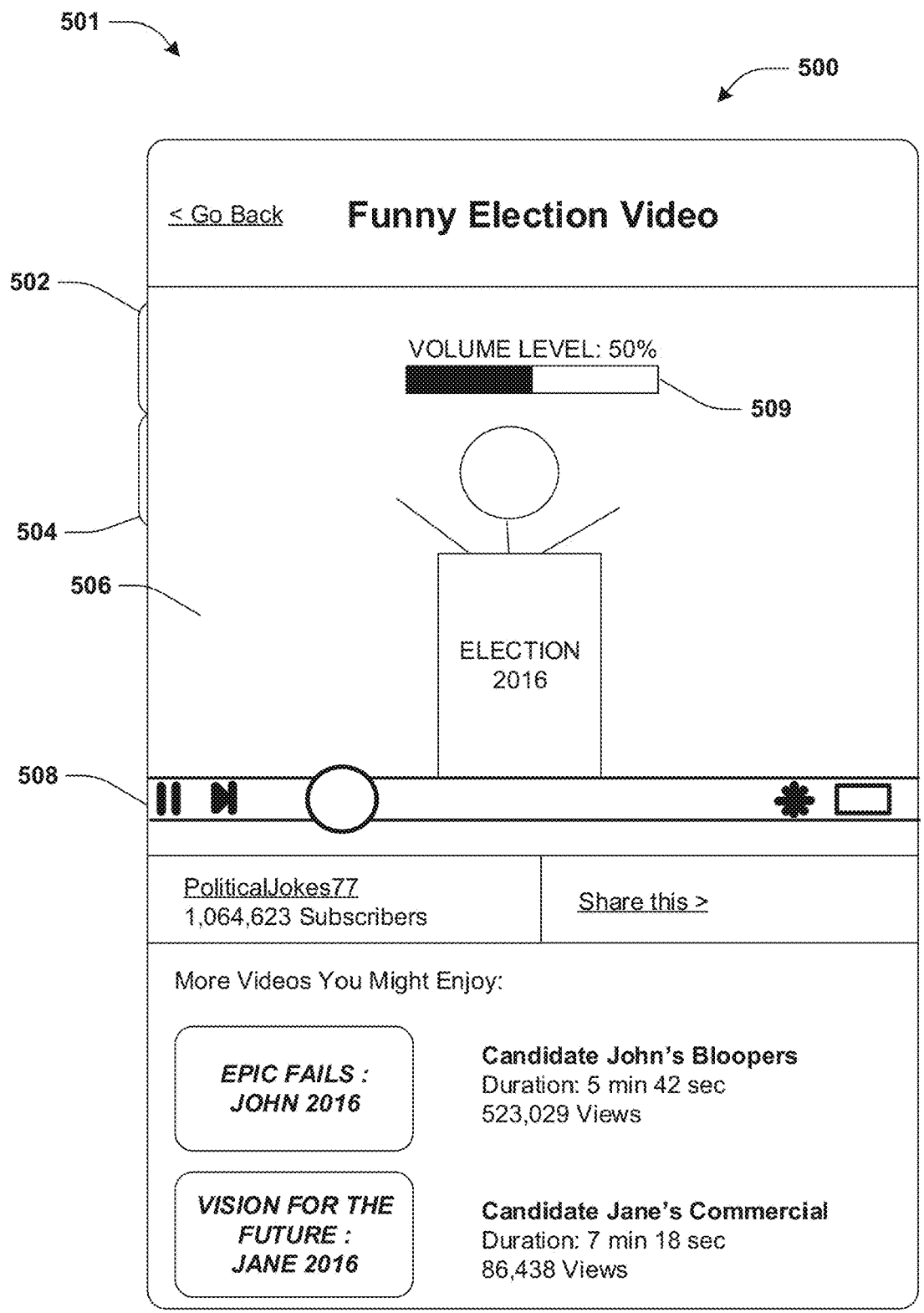
FIG. 5A is a component block diagram illustrating an example system for controlling a volume level of a device.

FIGS. 5A-5F illustrate examples of a system 501 for controlling a volume level. FIG. 5A illustrates a device 500 of a user that may display an interface. The device 500 may comprise a first button 502 and a second button 504 (e.g., physically built into the device). The device 500 may, in some examples, display an application, such as a video player, on the interface, which may include a video display portion 506 within which a video may be played, a video control bar 508, information about a source of the video, a control that when selected enables sharing the video, and/or one or more other recommended videos. The device 500 may further display, on the interface, a volume level indicator 509, which may indicate a current volume level of the device 500 and/or of the application. The current volume level may be displayed in textual form and/or in graphical form. It may be appreciated that the current volume level may be displayed in the volume level indicator 509 relative to (e.g., as a proportion of) a total range of the volume level supported by device 500 and/or the application. For example, the volume level indicator 509 may comprise a stacked bar graph comprising a first portion representative of a current volume level and a second portion representative of remaining volume level available (e.g., and supported by the device 500 and/or the application).

Figure 5B:
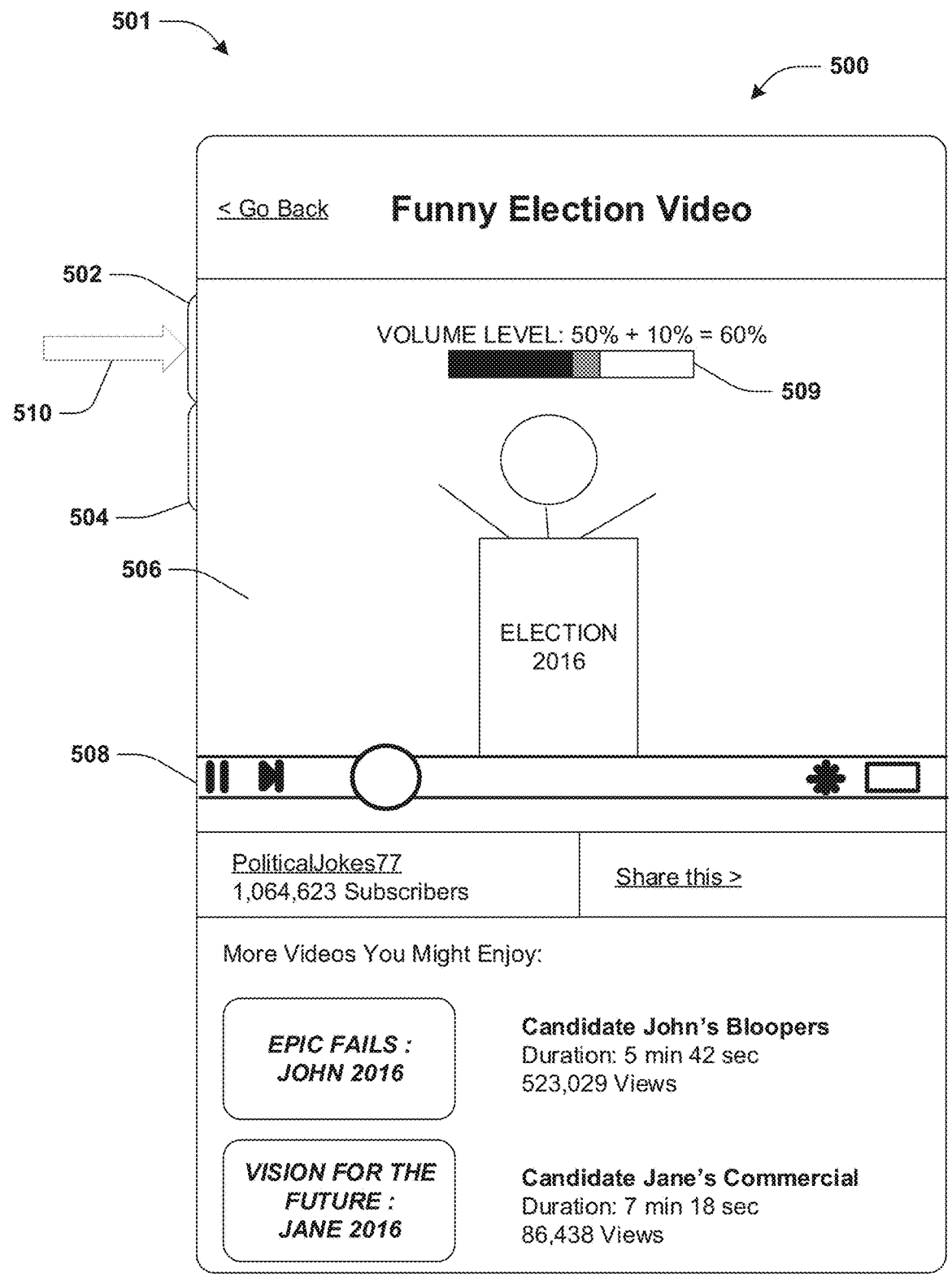
FIG. 5B is a component block diagram illustrating an example system for controlling a volume level of a device.

FIG. 5B illustrates a second instance of the device 500 when the user selects 510 (e.g., presses) the first button. In response to the selection, the volume level (e.g., 50%) may be modified by a first amount (e.g., 10%) in a first direction (e.g., towards the upper end of the total range of the volume supported). The first amount may be a default amount associated with the device 500 and/or the application, or may be a customized setting previously input by the user. The volume level indicator 509 may be updated to reflect the modification of the volume level by the first amount. For example, the volume level indicator 509 may indicate the previous volume level (e.g., 50%), the first amount (e.g., 10%) by which the volume level is to be adjusted, and an updated volume level (e.g., 60%) resulting from the adjustment of the volume level. For example, the volume level indicator 509 may comprise the stacked bar graph comprising a first portion representative of the initial volume level, a third portion representative of the first amount by which the volume level is being adjusted, and a second portion representative of the updated remaining volume level available (e.g., and supported by the device 500 and/or the application).

Figure 5C:
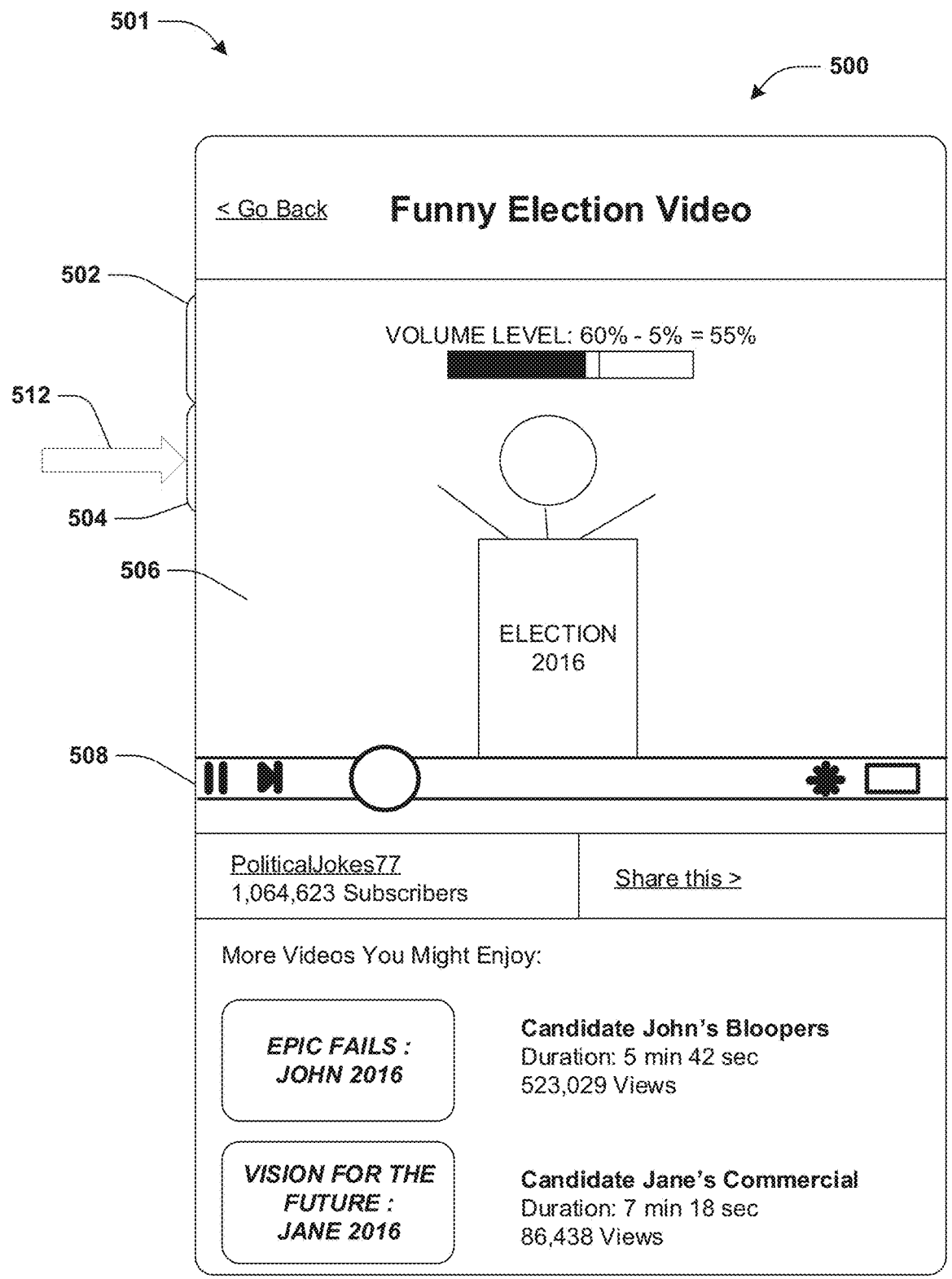
FIG. 5C is a component block diagram illustrating an example system for controlling a volume level of a device.

FIG. 5C illustrates a third instance of the device 500 when the user selects 512 (e.g., presses) the second button. In response to the selection, the volume level (e.g., 60%) may be modified by a second amount (e.g., 5%) in a second direction (e.g., towards the lower end of the total range of the volume supported). The second amount may be less than the first amount, and may be a portion (e.g., half) of the first amount determined using a function, where the function may be a default function associated with the device 500 and/or the application, or may be a customized setting previously input by the user. The volume level indicator 509 may be updated to reflect the modification of the volume level by the second amount. For example, the volume level indicator 509 may indicate the previous volume level (e.g., 60%), the second amount (e.g., 5%) by which the volume level is to be adjusted, and an updated volume level (e.g., 55%) resulting from the adjustment of the volume level. For example, the volume level indicator 509 may comprise the stacked bar graph comprising a first portion representative of the previous volume level, a third portion representative of the second amount by which the volume level is being adjusted, and the second portion representative of the updated remaining volume level available (e.g., and supported by the device 500 and/or the application).

Figure 5D:
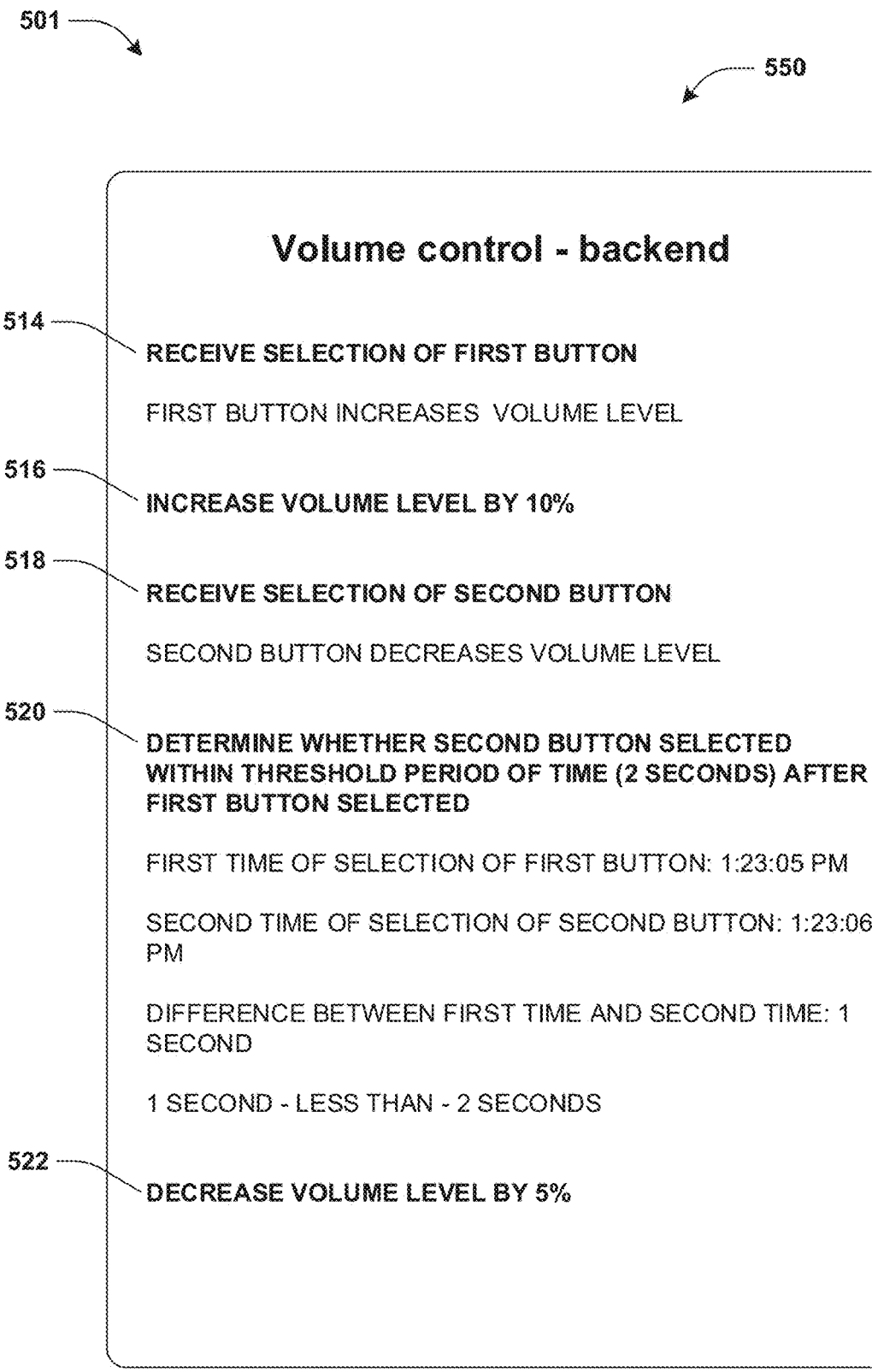
FIG. 5D is a component block diagram illustrating an example system for controlling a volume level of a device.

FIG. 5D illustrates a first instance of the backend system 550 for controlling the volume level of the device 500, where the first instance of the backend system 550 corresponds to the third instance of the device illustrated in FIG. 5C. The backend system 550 may perform and/or track actions comprising receiving 514 the selection of the first button, increasing 516 the volume level, and receiving 518 the selection of the second button. The backend system 550 may then determine 520 whether the second button was selected within a threshold period of time after the first button was selected. The determination 520 may be performed based upon a comparison of a first timestamp associated with selection of the first button and a second timestamp associated with selection of the second button. The backend system 550 may provide instructions to decrease 522 the volume level by the second amount responsive to determining that the second button was selected within the threshold period of time after the first button was selected.

Figure 5E:
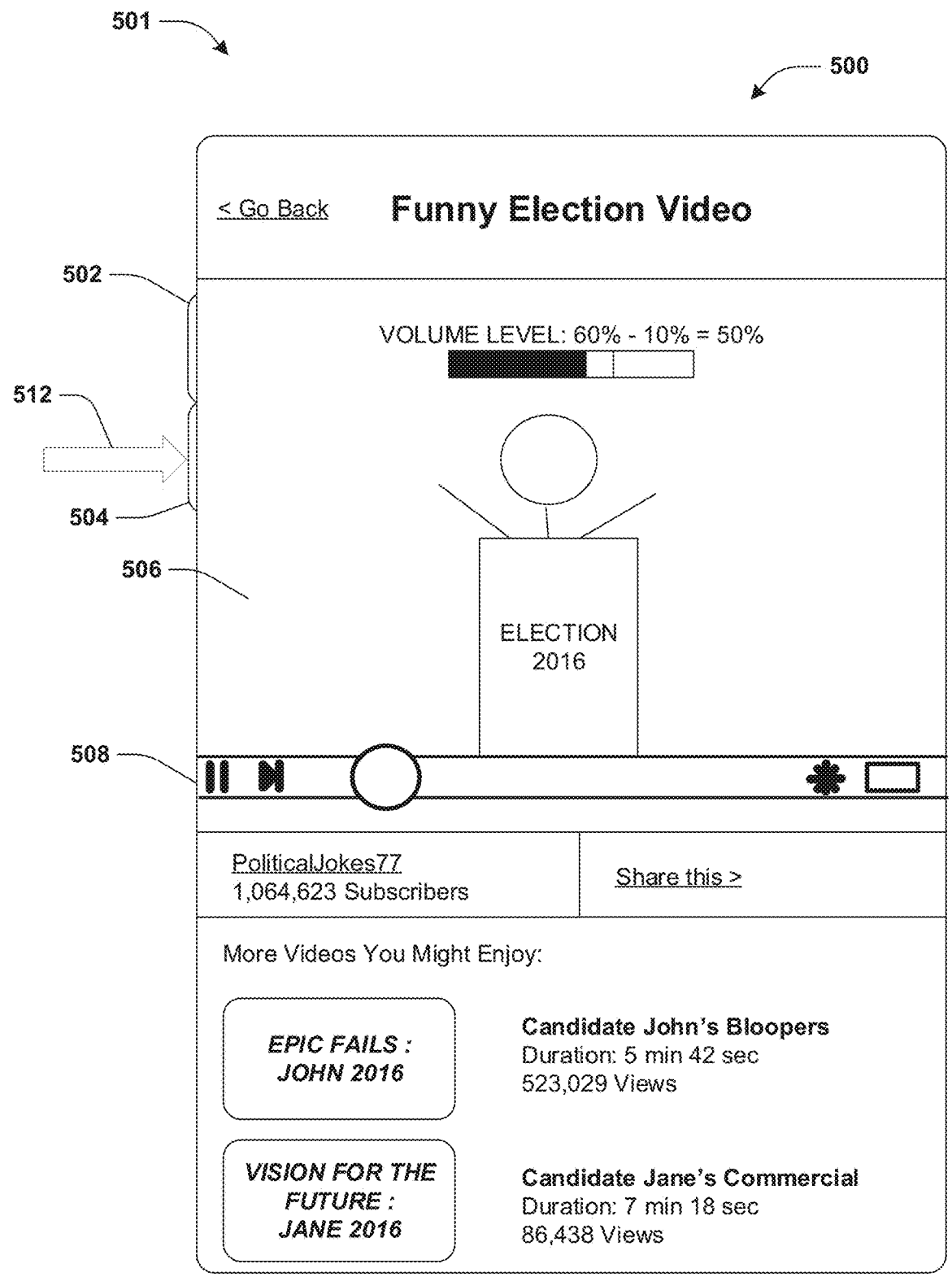
FIG. 5E is a component block diagram illustrating an example system for controlling a volume level of a device.

FIG. 5E illustrates a fourth instance of the device 500 when the user selects 512 (e.g., presses) the second button, that may occur instead of the third instance. In response to the selection, the volume level (e.g., 60%) may be modified by the first amount (e.g., 10%) in the second direction (e.g., towards the lower end of the total range of the volume supported). The volume level indicator 509 may be updated to reflect the modification of the volume level by the first amount. For example, the volume level indicator 509 may indicate the previous volume level (e.g., 60%), the first amount (e.g., 10%) by which the volume level is to be adjusted, and an updated volume level (e.g., 50%) resulting from the adjustment of the volume level. For example, the volume level indicator 509 may comprise the stacked bar graph comprising a first portion representative of the previous volume level, a third portion representative of the first amount by which the volume level is being adjusted, and the second portion representative of the updated remaining volume level available (e.g., and supported by the device 500 and/or the application).

Figure 5F:
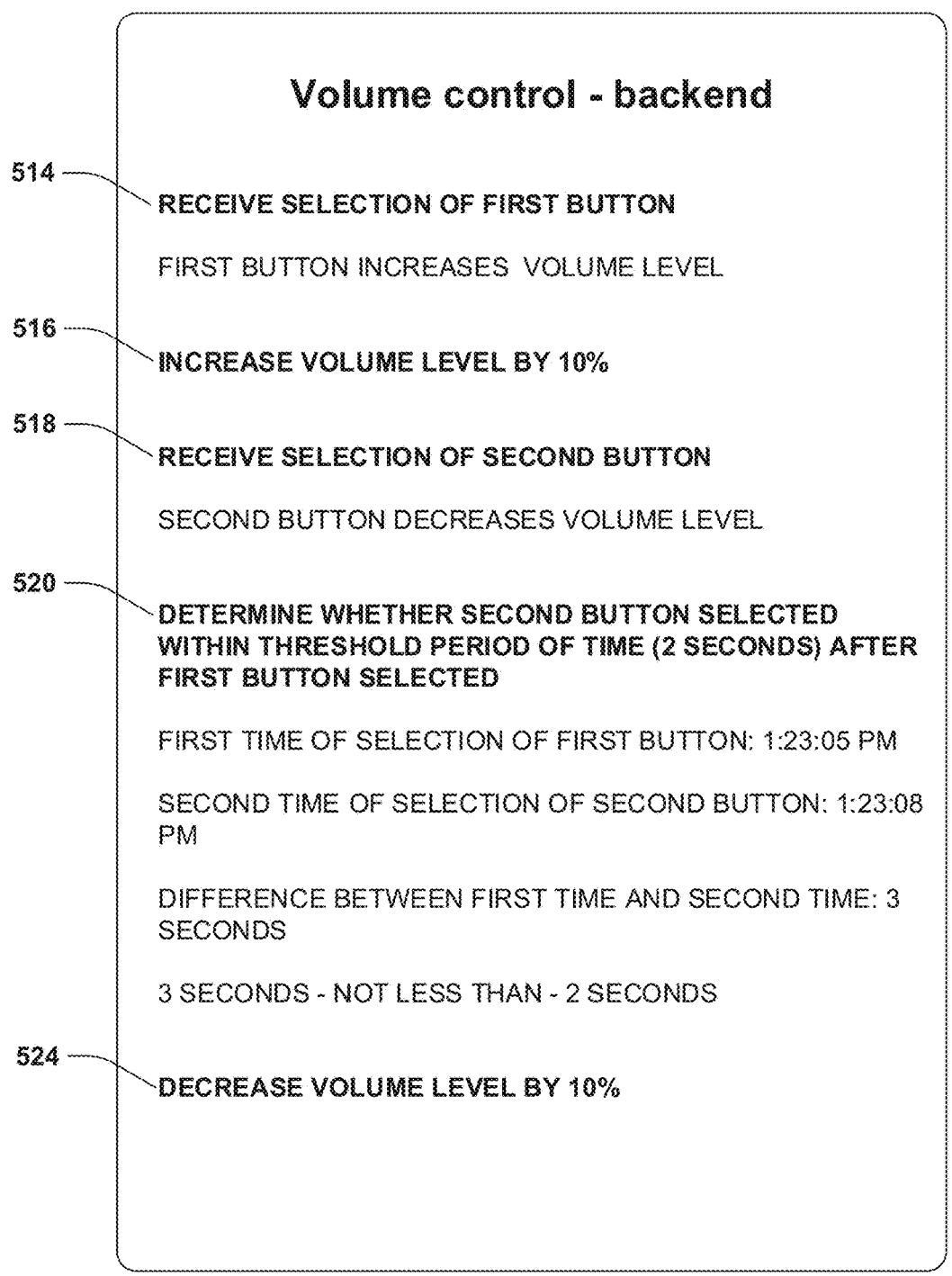
FIG. 5F is a component block diagram illustrating an example system for controlling a volume level of a device.

FIG. 5F illustrates a second instance of the backend system 550 for controlling the volume level of the device 500, where the second instance of the backend system 550 corresponds to the fourth instance of the device illustrated in FIG. 5E. The backend system 550 may perform and/or track actions comprising receiving 514 the selection of the first button, increasing 516 the volume level, and receiving 518 the selection of the second button. The backend system 550 may then determine 520 whether the second button was selected within a threshold period of time after the first button was selected. The determination 520 may be performed based upon a comparison of a first timestamp associated with selection of the first button and a second timestamp associated with selection of the second button. The backend system 550 may provide instructions to decrease 524 the volume level by the first amount responsive to determining that the second button was not selected within the threshold period of time after the first button was selected.

Implementation of at least some of the disclosed subject matter may lead to benefits including, but not limited to, reduction of processor and/or bandwidth used as a result of a decrease in a number of modifications to volume level needed to reach a desired volume level for a user, a reduction in wear and tear on a device (e.g., buttons, touchscreen, etc.) as a result of a decrease in a number of button selections needed to reach the desired volume level and/or an improved user experience that enables the user to reach a desired experience more easily and efficiently.

In some examples, at least some of the disclosed subject matter may be implemented on a client (e.g., a device of a user), and in some examples, at least some of the disclosed subject matter may be implemented on a server (e.g., hosting a service accessible via a network, such as the Internet).

Figure 6:
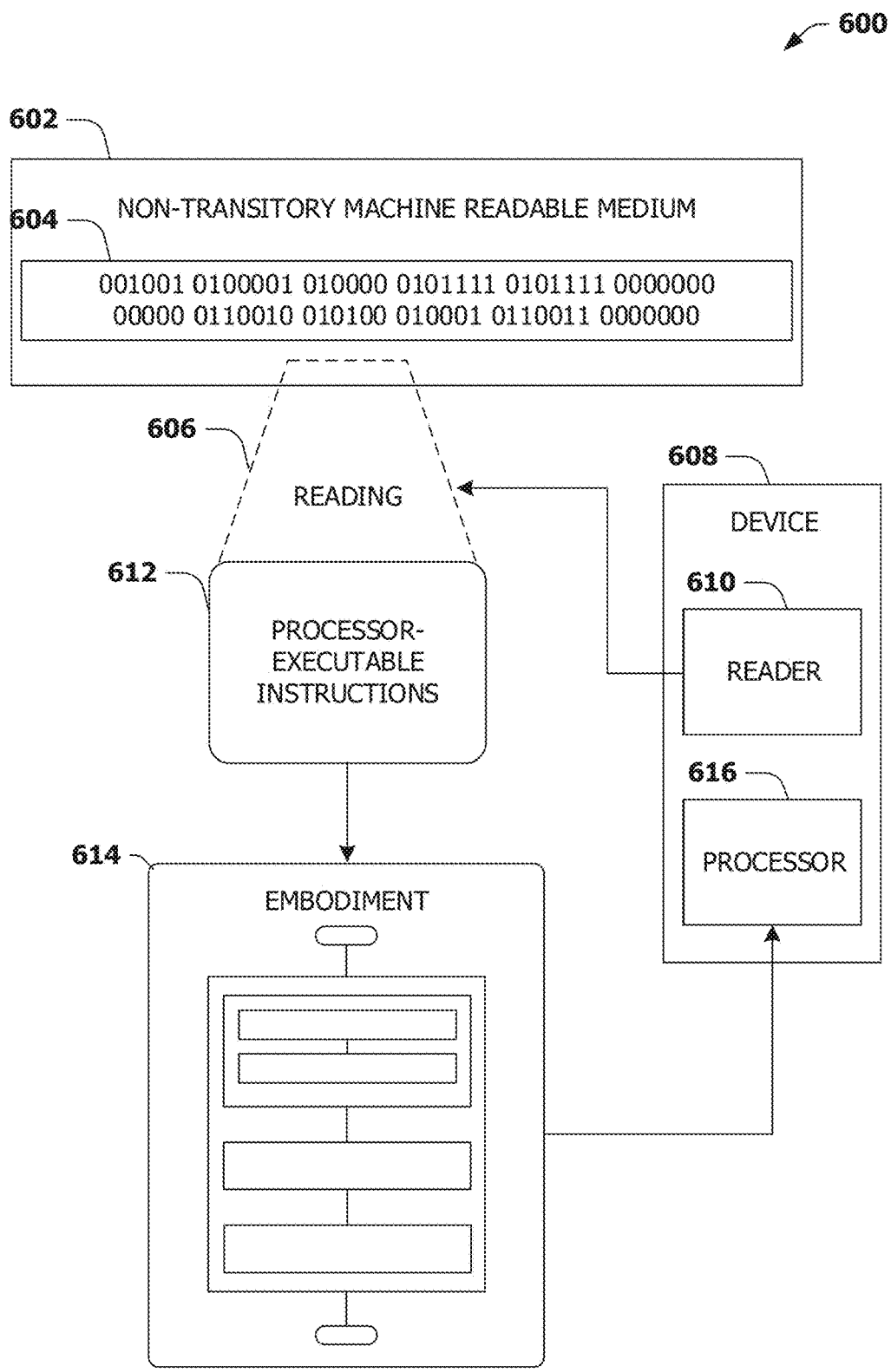
FIG. 6 is an illustration of a scenario featuring an example non-transitory machine readable medium in accordance with one or more of the provisions set forth herein.

FIG. 6 is an illustration of a scenario 600 involving an example non-transitory machine readable medium 602. The non-transitory machine readable medium 602 may comprise processor-executable instructions 612 that when executed by a processor 616 cause performance (e.g., by the processor 616) of at least some of the provisions herein. The non-transitory machine readable medium 602 may comprise a memory semiconductor (e.g., a semiconductor utilizing static random access memory (SRAM), dynamic random access memory (DRAM), and/or synchronous dynamic random access memory (SDRAM) technologies), a platter of a hard disk drive, a flash memory device, or a magnetic or optical disc (such as a compact disc (CD), digital versatile disc (DVD), or floppy disk). The example non-transitory machine readable medium 602 stores computer-readable data 604 that, when subjected to reading 606 by a reader 610 of a device 608 (e.g., a read head of a hard disk drive, or a read operation invoked on a solid-state storage device), express the processor-executable instructions 612. In some embodiments, the processor-executable instructions 612, when executed, cause performance of operations, such as at least some of the example method 400 of FIG. 4A and/or the example method 450 of FIG. 4B, for example. In some embodiments, the processor-executable instructions 612 are configured to cause implementation of a system, such as at least some of the example system 501 of FIGS. 5A-5H, for example.

3. Usage of Terms

As used in this application, "component," "module," "system", "interface", and/or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "example" is used herein to mean serving as an instance, illustration, etc., and not necessarily as advantageous. As used herein, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", and/or variants thereof are used in either the detailed description or the claims, such terms are intended to be inclusive in a manner similar to the term "comprising".

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Various operations of embodiments are provided herein. In an embodiment, one or more of the operations described may constitute computer readable instructions stored on one or more computer and/or machine readable media, which if executed will cause the operations to be performed. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method involving a device comprising a processor, and the method comprising:
   receiving a selection of a first button, of the device, corresponding to modifying a volume level associated with the device in a first direction;
   responsive to receiving the selection of the first button, displaying a volume level indicator representative of a first volume level corresponding to a modification of the volume level in the first direction, wherein the displaying the volume level indicator comprises displaying (i) a first representation of an initial volume level associated with the device prior to the modification of the volume level and (ii) a second representation of a first amount of the modification of the volume level in the first direction;
   receiving a selection of a second button, of the device, corresponding to modifying the volume level associated with the device in a second direction different than the first direction;
   responsive to receiving the selection of the second button, determining whether the selection of the second button was received within a threshold period of time after the selection of the first button; and
   responsive to determining that the selection of the second button was received within the threshold period of time after the selection of the first button, updating the volume level indicator to represent a second volume level corresponding to a modification of the volume level in the second direction, wherein the updating the volume level indicator to represent the second volume level comprises displaying (i) a third representation of the first volume level and (ii) a fourth representation of a second amount of the modification of the volume level in the second direction.

2. The method of claim 1, the second amount less than the first amount.

3. The method of claim 1, the device comprising a mobile phone, the first button comprising a first volume button of the mobile phone and the second button comprising a second volume button of the mobile phone.

4. The method of claim 1, the first button comprising a first volume button of headphones of the device and the second button comprising a second volume button of the headphones.

5. The method of claim 1, the device comprising a tablet, the first button comprising a first volume button of the tablet and the second button comprising a second volume button of the tablet.

6. The method of claim 1, the first button comprising a first volume button of speakers coupled to the device and the second button comprising a second volume button of the speakers.

7. The method of claim 1, the first button comprising a first virtual button and the second button comprising a second virtual button.

8. The method of claim 1, the first button comprising a first capacitive button and the second button comprising a second capacitive button.

9. The method of claim 1, the first button comprising a first mechanical button and the second button comprising a second mechanical button.

10. The method of claim 1, comprising:
    receiving a second selection of the first button;
    responsive to receiving the second selection of the first button, determining whether the second selection of the first button was received within a second threshold period of time after the selection of the second button, the threshold period of time equal to the second threshold period of time; and
    responsive to determining that the second selection of the first button was received within the second threshold period of time after the selection of the second button, modifying the volume level associated with the device by a third amount, less than the second amount, in the first direction.

11. The method of claim 1, comprising:
    receiving a second selection of the first button;
    responsive to receiving the second selection of the first button, determining whether the second selection of the first button was received within a second threshold period of time after the selection of the second button, the threshold period of time different than the second threshold period of time; and
    responsive to determining that the second selection of the first button was received within the second threshold period of time after the selection of the second button, modifying the volume level associated with the device by a third amount, less than the second amount, in the first direction.

12. The method of claim 1, the first direction corresponding to an increase in the volume level, the second direction corresponding to a decrease in the volume level.

13. The method of claim 1, the first direction corresponding to a decrease in the volume level, the second direction corresponding to an increase in the volume level.

14. The method of claim 1, comprising:
    receiving a second selection of the first button;
    responsive to receiving the second selection of the first button, determining whether the second selection of the first button was received within a second threshold period of time after the selection of the second button; and
    responsive to determining that the second selection of the first button was received within the second threshold period of time after the selection of the second button, modifying the volume level associated with the device by a third amount, less than the second amount, in the first direction, the third amount about half of the second amount.

15. A computing device comprising:
    a processor; and
    memory comprising processor-executable instructions that when executed by the processor cause performance of operations, the operations comprising:
       receiving a selection of a first button corresponding to modifying a volume level associated with a device in a first direction;
       responsive to receiving the selection of the first button, displaying a volume level indicator representative of a first volume level corresponding to a modification of the volume level in the first direction, wherein the displaying the volume level indicator comprises displaying (i) a first representation of an initial volume level associated with the device prior to the modification of the volume level and (ii) a second representation of a first amount of the modification of the volume level in the first direction;

receiving a selection of a second button corresponding to modifying the volume level associated with the device in a second direction different than the first direction;

responsive to receiving the selection of the second button, determining whether the selection of the second button was received within a threshold period of time after the selection of the first button; and responsive to determining that the selection of the second button was received within the threshold period of time after the selection of the first button, updating the volume level indicator to represent a second volume level corresponding to a modification of the volume level in the second direction.

16. The computing device of claim 15, the first button comprising a first virtual button and the second button comprising a second virtual button.

17. A non-transitory machine readable medium having stored thereon processor-executable instructions that when executed cause performance of operations, the operations comprising:

receiving a selection of a first button corresponding to modifying a setting level associated with a device in a first direction;

responsive to receiving the selection of the first button, displaying a setting level indicator representative of a first setting level corresponding to a modification of the setting level in the first direction, wherein the displaying the setting level indicator comprises displaying (i) a first representation of an initial setting level associated with the device prior to the modification of the setting level and (ii) a second representation of a first amount of the modification of the setting level in the first direction;

receiving a selection of a second button corresponding to modifying the setting level associated with the device in a second direction different than the first direction;

responsive to receiving the selection of the second button, determining whether the selection of the second button was received within a threshold period of time after the selection of the first button; and responsive to determining that the selection of the second button was received within the threshold period of time after the selection of the first button, updating the setting level indicator to represent a second setting level corresponding to a modification of the setting level in the second direction.

18. The non-transitory machine readable medium of claim 17, the setting level comprising a contrast level or a brightness level.

19. The non-transitory machine readable medium of claim 17, the setting level comprising a saturation level or a sharpness level.

20. The non-transitory machine readable medium of claim 17, the setting level comprising a fast forwarding level or a rewinding level.

* * * * *